United States Patent
Gailhard et al.

(10) Patent No.: US 6,667,646 B2
(45) Date of Patent: Dec. 23, 2003

(54) SMALL-SIZED DIGITAL GENERATOR PRODUCING CLOCK SIGNALS

(75) Inventors: Bruno Gailhard, Trets (FR); Olivier Ferrand, Puyloubier (FR)

(73) Assignee: STMicroelectronics SA, Montrouge (FR)

( * ) Notice: Subject to any disclaimer, the term of this patent is extended or adjusted under 35 U.S.C. 154(b) by 132 days.

(21) Appl. No.: 10/021,287

(22) Filed: Oct. 30, 2001

(65) Prior Publication Data

US 2002/0109536 A1 Aug. 15, 2002

(30) Foreign Application Priority Data

Oct. 30, 2000 (FR) .............................. 00 13896

(51) Int. Cl.[7] .......................... H03B 27/00; H03B 7/30
(52) U.S. Cl. ..................... 327/281; 327/261; 331/57
(58) Field of Search ............................. 327/281, 263, 327/264, 274, 288; 331/57

(56) References Cited

U.S. PATENT DOCUMENTS

| | | | | |
|---|---|---|---|---|
| 5,355,097 A | * | 10/1994 | Scott et al. ................. | 331/1 A |
| 5,420,546 A | * | 5/1995 | Watanabe et al. ............. | 331/57 |
| 5,687,202 A | | 11/1997 | Eitrheim ..................... | 375/376 |
| 5,691,661 A | * | 11/1997 | Fukuda et al. .............. | 327/362 |
| 5,920,216 A | | 7/1999 | Fischer ....................... | 327/158 |
| 5,994,934 A | * | 11/1999 | Yoshimura et al. ........... | 37/158 |
| 6,008,700 A | * | 12/1999 | Pietrzyk ..................... | 331/57 |
| 6,064,271 A | * | 5/2000 | Okubo et al. ................. | 331/2 |
| 6,459,652 B1 | * | 10/2002 | Lee et al. .................... | 331/1 A |

FOREIGN PATENT DOCUMENTS

EP 0528283 2/1993 ............. G06F/1/04

* cited by examiner

*Primary Examiner*—Dinh T. Le
(74) *Attorney, Agent, or Firm*—Lisa K. Jorgenson; Allen, Dyer, Doppelt, Milbrath & Gilchrist, P.A.

(57) ABSTRACT

A generator includes an oscillator for producing a clock signal from N logic signals representing an N-bit control number, with N being an integer greater than 1. The oscillator has N+1 components. The N most significant components are each assigned a place value i ranging from 1 to N, and a least significant component provides the clock signal. At least one component with a place value i greater than 1 includes first and second arms. The first arm includes a cell and a first switch connected in series, and the second arm includes $1+2^1$ cells and a second switch connected in series. Each cell includes an odd number of inverters.

32 Claims, 2 Drawing Sheets

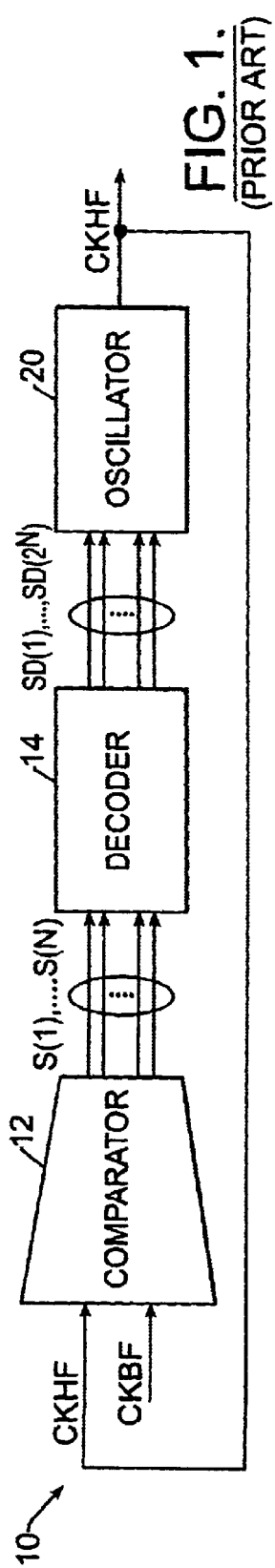
FIG. 1.
(PRIOR ART)
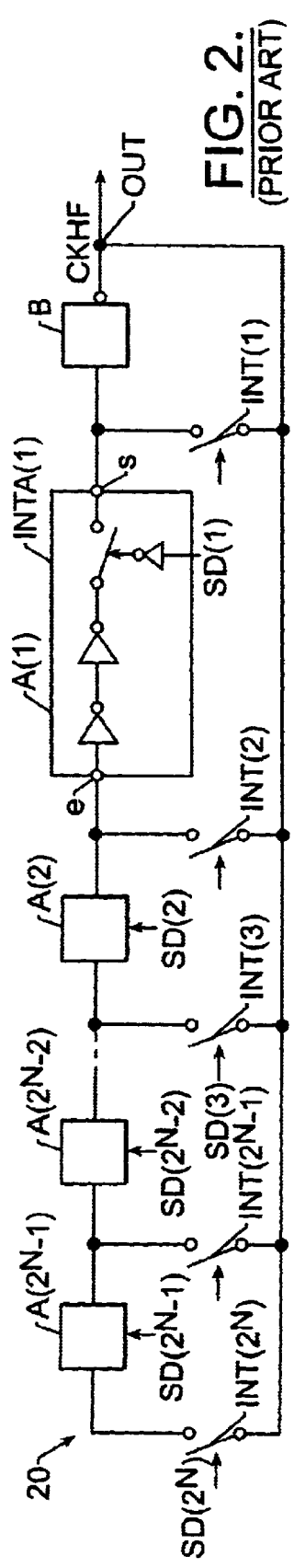
FIG. 2.
(PRIOR ART)
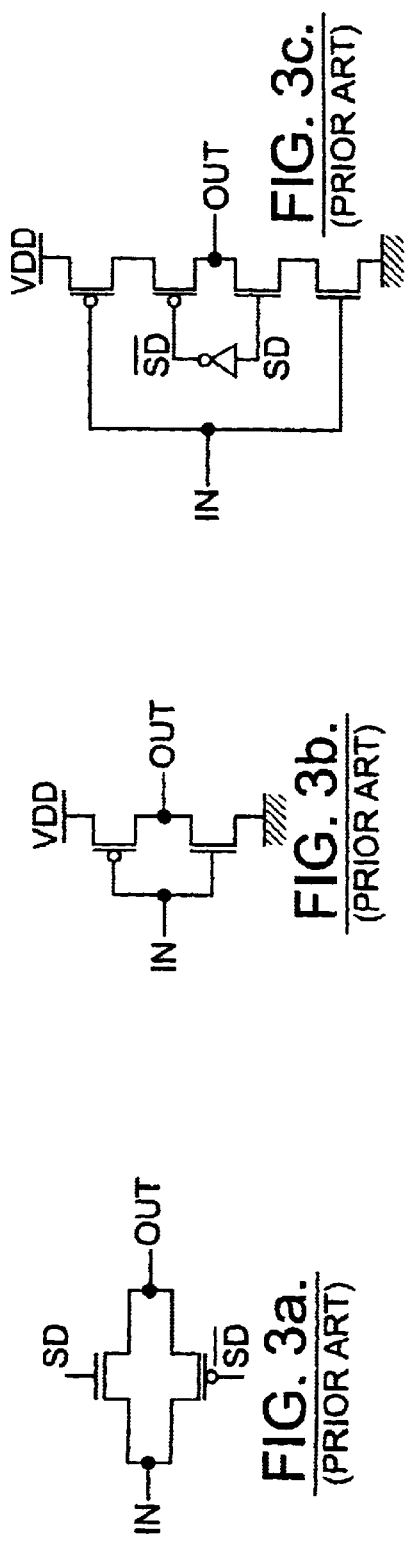
FIG. 3a.
(PRIOR ART)
FIG. 3b.
(PRIOR ART)
FIG. 3c.
(PRIOR ART)

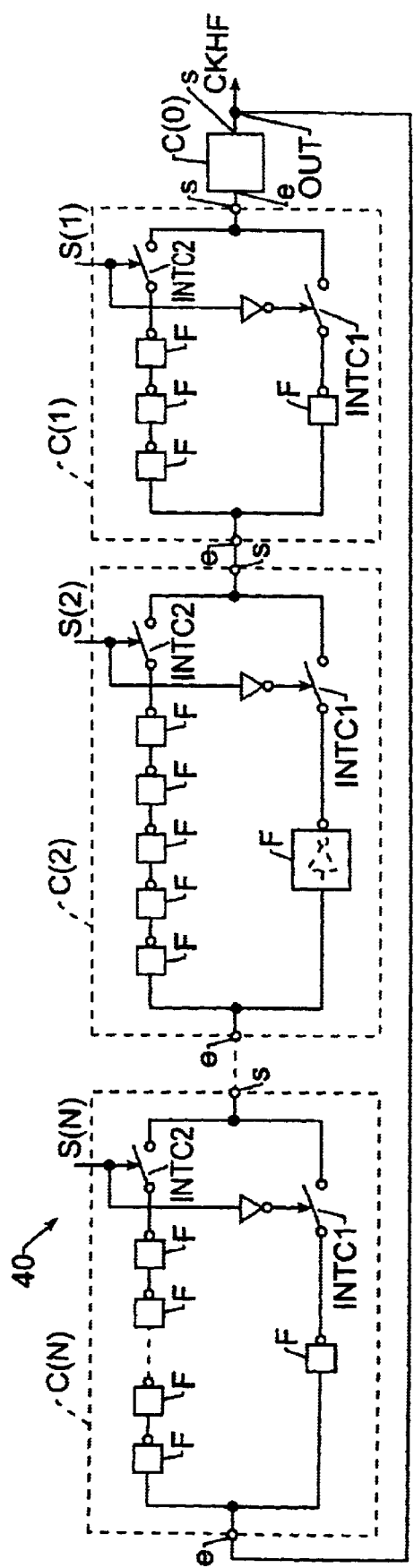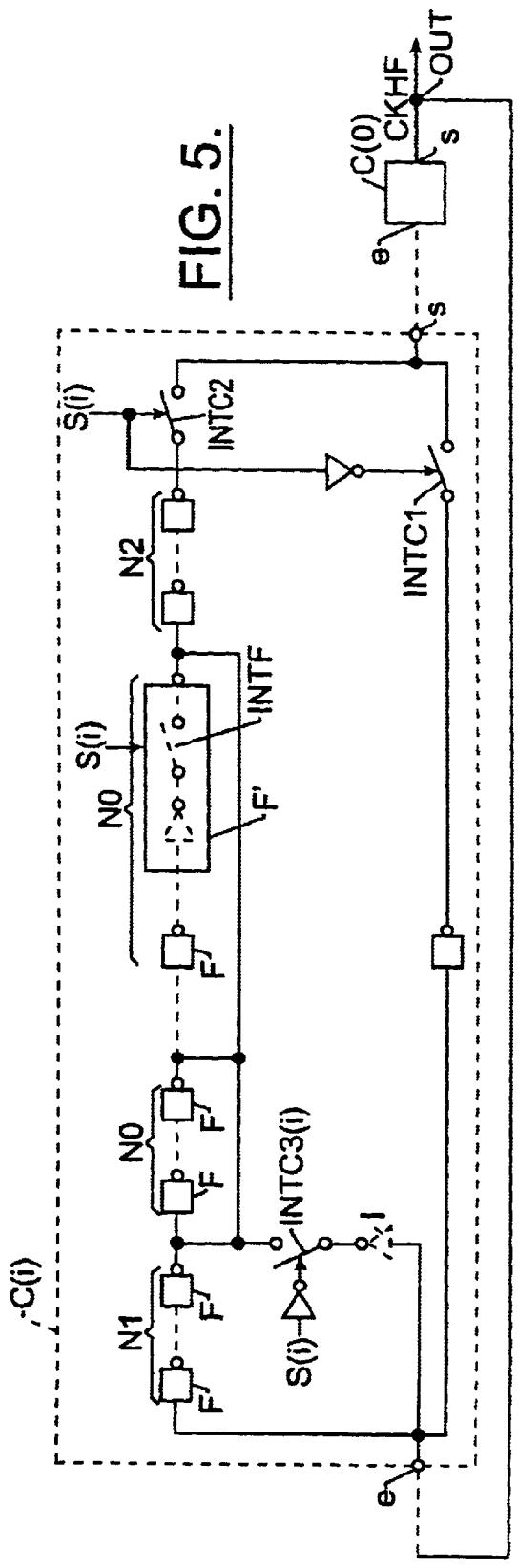

SMALL-SIZED DIGITAL GENERATOR PRODUCING CLOCK SIGNALS

FIELD OF THE INVENTION

The invention relates to phase-locked loop type clock-signal generators that produce a high-frequency clock signal from a low-frequency clock signal. Among these generators, the invention relates more specifically to those using a digital oscillator producing clock signals whose period is proportional to a binary number received by the oscillator.

BACKGROUND OF THE INVENTION

A prior art generator 10 according to FIG. 1 has a comparator 12, a binary number decoder 14 and a digital oscillator 20 that are series connected. An output of the oscillator 20 is connected to an input of the comparator 12. The generator 10 provides a high-frequency signal CKHF (with a period PHF) from a low-frequency reference signal CKBF (with a period PBF).

The comparator 12 has two inputs to which the high-frequency signal CKHF and the reference signal CKBF are applied. The comparator 12 compares the period PHF of the clock signal CKHF with a desired period PHF0. The desired period PHF0 is, for example, a multiple of the period PBF. At N serial outputs, the comparator 12 produces a number NR in the form of $N=2^N$ binary signals $S(1), \ldots, S(N)$ representing the bits of NR. The number NR has the following characteristics: NR increases if PHF<PHF0, NR decreases if PHF>PHF0, otherwise NR is constant.

The binary signal decoder 14 has N inputs connected to the outputs of the comparator 12. The decoder 14 provides decoded binary clock signals $SD(1), SD(2), \ldots, SD(2^N)$ at $2^N$ serial outputs. These decoded binary signals indicate the value of the number NR given by the counting circuit: $S(NR+1)=1$, and $S(i)=0$ for all values of i ranging from 1 to $2^N$, and $i \neq NR+1$.

The digital oscillator 20 receives the binary signals $SD(1), SD(N), \ldots, SD(2^N)$ and produces the clock signal CKHF at a serial output OUT. The oscillator 20 is shown in FIG. 2. It comprises $2^N-1$ elementary cells $A(1)$ to $A(2^N-1)$ that are identical, and one cell B that is different from the cells $A(j)$, with j being an integer ranging from 1 to $2^N-1$. Each cell $A(j)$, B comprises a data input e and a data output s.

The input e of the cell B is connected, first, to its output s by a switch INT(1) controlled by the signal SD(1) and, second, to the output of the cell A(1). The input of each cell $A(1)$ to $A(2^N-2)$ is connected, first, to the output s of the cell B by a switch INT(2) to $INT(2^N-1)$ controlled by the signal $SD(2)$ to $SD(2^N-1)$ and, second, to the output of the next cell $A(2)$ to $A(2^N-1)$. The input of the cell B is connected to the output of the cell A(1), and the output of the cell $A(2^N-1)$ is connected to the output of the cell B by a switch $INT(2^N)$ controlled by the signal $SD(2^N)$. The switch INT(i), with i ranging from 1 to $2^N$, is closed when the signal SD(i) is active. If not it is open.

The output of the cell B is the output OUT of the oscillator 20 at which the high-frequency CKHF is given. The cell B comprises an odd number NB of series connected primary inverters, with $NB \geq 1$. The output of the first inverter is connected to the output of the cell B, and the input of the $NB^{th}$ inverter is connected to the input e of the cell B. The cell B is equivalent to an inverter whose propagation times (downward propagation time TB0 and upward propagation time TB1≠TB0) are greater than the propagation times of the primary inverters that form it.

Since all the cells $A(1)$ to $A(2^N-1)$ are identical, only the first cell $A(i=1)$ is described in detail in FIG. 2. The first cell comprises an even number NA of identical primary inverters (in the example of FIG. 2, NA=2) series connected with a switch $INTA(i=1)$ controlled by the signal $SD(i=1)$ by an inverter. The input of the last inverter is connected to the input of the cell A(1), and the output of the switch INTA(1) is connected to the output of the cell A(1). The switch INTA(1) is open when SD(1) is active. If not it is closed.

The switch INTA(1) is necessary for isolating the primary inverters from one another. Without the presence of the switch INTA(1), the output of an inverter of the cell A(1) and the output of an inverter of the cell B would be short-circuited at the closing of the switch INT(1).

A cell A(1) to $A(2^N-1)$ comprises a number NA of inverters. It is equivalent to a delay circuit. The cell transmits the signal that it receives at its input to its output, after a period of time TA0 if the signal is equal to 0, or after a period of time TA1 if the signal is equal to 1. The propagation times TA0, TA1 are different from each other because the propagation time of a 0 in a switch INTA is different from the propagation time of a 1 in the same switch.

The clock signal generator 10 works as follows. The comparator 12 provides a number NR ranging from 0 to $2^N-1$ and produces an associated signal $SD(NR+1)=1$, with the other signals $SD(i \neq NR+1)$ being all zero signals. The switch INT(NR+1) controlled by the signal SD(NR+1) closes and the switch INTA(NR+1) opens. NR cells A are selected to form, with the cell B, a looped chain of cells A, B in the oscillator 20.

The propagation time of a 0 between the input and the output of the chain of cells is equal to $T10=NR*TA0+TB1$, and the propagation time of a 1 between the input and output of the chain of cells is equal to $T11=NR*TA1+TB0$. The period PHF of the high-frequency signal CKBF obtained at the output OUT of the oscillator is equal to $PHF=T10+T11=NR*(TA1+TA0)+(TB1+TB0)$. It is therefore proportional to NR.

If the period obtained PHF is smaller than the desired period PHF0, then the number NR is increased by the comparator 12 to increase the number of cells A in the chain of cells, and thus increase the period PHF of the signal CKHF. Conversely, if the signal obtained PHF is greater than the desired period PHFO, then the number NR is diminished by the comparator 12 to diminish the number of cells A in the loop, and thus reduce the period of CKHF.

In other words, in the oscillator 20, the total number of cells, and therefore the total number of inverters in the chain of cells, varies as a function of the number NR given by the comparator 12, and the period PHF of the clock signal obtained is proportional to NR. The total number of inverters in the chain, however, must be an odd number in order that there may be oscillations.

Furthermore, when NR increases (or decreases) by one, a cell A is added (or eliminated) in the chain. It may be recalled that a cell A comprises an even number NA of inverters and a switch INTA.

The minimum variation of the period of a signal CKHF produced by the oscillator 20 defines the uncertainty on the period of the signal CKHF, in other words, the precision of the oscillator. For the oscillator 20, the uncertainty on the period is therefore equal to TA0+TA1, with TA0 and TA1 being the propagation time of a 0 and a 1 in a cell A comprising an even number of inverters and a switch INTA.

By way of an indication, exemplary embodiments of switches $INT(1), \ldots, INT(2^N)$ and primary inverters used in the cells A(1), ..., A($2^N$-1), B are shown in FIGS. 3a and 3b. When a switch has to be series connected with an inverter, as is the case in the cells A(1), ..., A($2^N$-1), then these two elements are preferably made in the form of a single circuit like that of FIG. 3c, which shows an inverter switch.

A first problem of signal generators such as that of FIG. 1 is the large size of these circuits. The decoders include a set of at least $2^N$ logic gates, with at least one per binary signal SD(i) being produced. The decoders thus become bulky very soon when the number n rises.

A second problem of existing generators is related to the construction of inverter-based oscillators. All the cells A(1), ..., A($2^n$-1), B are physically linked to the output point S of the oscillator 20, directly or by a switch. Thus, the parasitic capacitance at this point is very high, due to the cells themselves, the switches and the connecting wires between the elements of the circuit. This capacitance leads to parasitic oscillations, for example, when two switches placed side by side switch simultaneously. These oscillations can result in errors in the oscillator 20, for example, when there is an unwanted conversion of a 0 to a 1.

A third problem lies in the fact that the cycle ratio of the signal CKHF obtained, equal to the time during which the signal is in the high state divided by the period of the signal, is different from ½.

Due to the presence of a switch INT(i) and an even number NA of inverters in the cell A(i), the propagation time T10 of a 0 and the propagation time T11 of a 1 in the chain of cells are substantially different from each other. Thus, the cycle ratio of the signal CKHF obtained, which is equal to T11/PHF=T11/(T10+T11), is different from ½.

SUMMARY OF THE INVENTION

In view of the foregoing background, an object of the invention is to provide a small-sized clock signal generator while preferably eliminating the decoder, which is generally used in this type of circuit.

Another object of the invention is to provide a clock signal generator having a parasitic capacitance distributed throughout the circuit, which is no longer concentrated at the output of the oscillator.

Yet another object of the invention is to provide a generator that produces substantially perfect clock signals, and preferably having a cycle ratio equal to ½.

These and other objects, advantages and features according to the invention are provided by a generator comprising an oscillator producing a clock signal from N logic signals representing an N-bit control number, with N being an integer greater than 1.

According to the invention, the oscillator comprises N+1 components. Each of the N most significant components are assigned a place value i, with i ranging from 1 to N. The least significant component gives the clock signal, and at least one component (C(i)) with a place value i greater than 1 comprises first and second arms. The first arm comprises, connected in series, a cell and a first switch controlled by the logic signal with a place value i. The first switch is open when the logic signal with the place value i is active. The second arm comprises, connected in series, cells and a second switch controlled by the logic signal with a place value i. The second switch is closed when the logic signal with the place value i is active.

Thus, the oscillator of the generator of the invention makes direct use of the N binary signals produced by the comparator as will be seen more clearly below. The decoder of the prior art circuit is therefore eliminated.

Furthermore, every common point of the oscillator is connected to a small number of components. For example, the input of the component with a place value I is connected only to the two arms of the component with the place value I, and to the two arms of the component with the place value I+1. Consequently, the parasitic capacitance of the oscillator is thus distributed throughout the elements of this circuit, and there is no longer any excessively capacitive point, which is a source of error.

Preferably, the second arm of the component with the place value i comprises a number of cells equal to $2^i+1$. This number is an odd number. Consequently, two adjacent cells of the second type constantly receive opposite logic signals and the cycle ratio of the high-frequency signal, obtained with a generator of the invention, is equal to ½, as shall be seen more clearly below.

Preferably, the least significant component comprises an even number of inverters if N is an odd number, or an odd number of inverters if N is an even number. Preferably again, each cell comprises an odd number of series connected inverters. Consequently, regardless of the value of the number NR, the total number of inverters in the chain of cells is always an odd number. The oscillations are therefore always possible. Each cell may also comprise a switch series connected with the inverters. The output of each cell can thus be isolated from the output of any other cell if necessary.

According to a preferred embodiment, the oscillator also comprises means to apply a precharging signal to the cells of the first and second arms of the component with the place value i. For the component with the place value i, the precharging signal is either the clock signal or the signal applied to an input of the component with a place value i.

A generator according to the invention comprises, in addition to an oscillator such as the one described above, a comparator to compare the period of the clock signal with a desired period and provide an N-bit control number in the form of N logic signals. The control number varies as follows. The control number increases if the period of the clock signal is smaller than the desired period. The control number decreases if the period of the clock signal is greater than the desired period, and if not, the control number is constant.

BRIEF DESCRIPTION OF THE DRAWINGS

The invention will be understood more clearly and other features and advantages shall appear from the following description, made with reference to the appended drawings, of which:

FIG. 1 is a functional block diagram of a clock signal generator according to the prior art;

FIG. 2 is a detailed block diagram of the oscillator illustrated in FIG. 1;

FIGS. 3a to 3c are detailed schematic diagrams of different embodiments of a cell within the oscillator illustrated in FIG. 2;

FIG. 4 is a detailed schematic diagram of an oscillator according to the present invention; and FIG. 5 is a detailed schematic diagram showing another embodiment of the oscillator illustrated in FIG. 4.

DETAILED DESCRIPTION OF THE PREFERRED EMBODIMENTS

An oscillator according to the invention is shown in FIG. 4. The oscillator is used in a clock signal generator (not shown) comprising one comparator and the oscillator 40. The comparator is identical to that of FIG. 1, and provides the oscillator 40 binary signals S(1) to S(N) representing an N-bit number NR.

The oscillator 40 comprises N+1 components C(0) to C(N). Each component comprises a data input e and a data output s. The components C(1) to C(N) also have a control input to which the signal S(1) to S(N) is applied.

The components C(0) to C(N) are series connected. The input e of the components C(0) to C(N−1) is connected respectively to the output s of the components C(1) to C(N), and the input e of the component C(N) is connected to the output s of the component C(0) which is the output OUT of the oscillator 40.

Each component C(i), with a place value i ranging from 1 to N, has two parallel-connected arms between the input e and the output s of the component C(i). For each component C(i), the first arm comprises a cell F series connected with a switch INTC1(i) and is controlled by the signal S(i) provided via an inverter. The switch INTC1 is open if the signal S(i) is active, for example, equal to 1. If not, it is closed.

For each component C(i), the second arm has a number $NC(i)=1+2^i$ of cells F series connected with a switch INTC2(i) controlled by the signal S(i). The switch INTC2(i) is closed if the signal S(i) if active. If not, it is open. All the cells F of all the components C(1) to C(N) are identical. Each of them includes an odd number NF of primary inverters, series connected between the input and the output of the cell F. In the example of FIG. 4, NF is equal to 1.

The component C(0) comprises a number ND of series connected inverters. It is known that there must necessarily be an odd total number of inverters in the chain in order that the oscillations may be possible. The number ND of inverters in the component C(0) has the following characteristics: ND is an odd number if N is an even number, and ND is an even number if N is an odd number. The propagation time of a 0 in the component C(0) is equal to TD0, and the propagation time of a 1 is equal to TD1.

The oscillator 40 of FIG. 4 works as follows. Depending on the number NR given by the comparator and on the corresponding signals S(1), ..., S(N), one of the switches INTC1(i), INTC2(i) of a same component C(i) is closed and the other is open, thus forming a variably long chain of cells F (and therefore of inverters) series connected with the component C(0).

The total number of cells F in the chain thus varies between N and $N-2+2^{N+1}$, according to the value of the number NR. Whenever the number NR is incremented or decremented by 1, the signals S(1), ..., S(N) produced by the comparator are modified accordingly. The state of the switches of the components C(1), ..., C(N) is modified accordingly, and the total number of cells F in the chain is increased or reduced by 2.

This can be seen clearly in the following example in which it is assumed that, initially, NR is equal to 1. The signals S(2) to S(N) are equal to 0, and S(1) is equal to 1. The switches INTC1(i) are closed and the switches INTC2(i) are open for all values of i greater than or equal to 2. However, the switch INTC2(1) is closed and the switch INTC1(1) is open. The chain of cells, in this case, includes the first arms of the components C(2) to C(N), the second arm of the component C(1) and the component C(0). The chain of cells therefore comprises (N−1)*1+3 N+2 cells F.

If NR is increased by 1, then the signals S(1), S(3) to S(N) are equal to 0 and the signal S(2) is equal to 1. The switches INTC1(1), INTC1(3) to INTC1(N) are open and the switches INTC2(1), INTC2(3) to INTC2(N) are closed. However, the switch INTC1(2) remains open and the switch INTC2(2) is closed. The chain of inverters, in this case, includes (N−2)*1+5+1=N+4 cells F.

Thus, by varying the number NR by 1, the number of cells F in the chain has clearly increased by 2. The period PHF of the clock signal obtained is increased by TF0+TF1, with TF0 being the descending time and TF1 being the rising time in a cell F.

The oscillator according to the invention therefore works similarly to the known oscillator of FIG. 2. The number of cells in the looped chain, and therefore the period PHF of the high-frequency signal CKHF at the output of the oscillator 40, varies linearly with NR. It may be recalled that NR is given by the comparator in the form of N binary signals S(l) to S(N). NR is increased or decreased as a function of the difference between the period PHF of the signal CKHF and a desired value PHF0.

The oscillator 40 according to the invention makes direct use of the binary signals produced by the comparator 12. Consequently, a generator according to the invention does not include a decoding circuit. A generator according to the invention using an oscillator 40 such as the one of FIG. 4 therefore effectively has a reduced size as compared with a generator such as the one illustrated in FIG. 1.

As can be seen in FIG. 4, at most two outputs of cells (and hence inverters) and two outputs of switches are connected at the same point of the circuit. The parasitic capacitance is thus distributed on all the elements of the oscillator 40 and there are no longer any excessively capacitive points.

The cycle ratio of the oscillator according to the invention is also improved as compared with that of the prior art oscillator 20. The cells F have different rising times TF1 and descending times TF0 because the inverter or inverters (whose number NF is an odd number) that form them have different rising and falling times. On the contrary, for any number NR, the chain comprises N+2*NR cells F and the component C(0) has two adjacent cells F which always receive opposite signals 0 or 1 at their input.

The propagation time of a 0 in the oscillator 40 is equal to T20=(TF0+TF1)*(N+2*NR)/2+TD1, and the propagation time of a 1 is equal to T21=(TF0+TF1) *(N+2*NR)/2+TD0. Since the terms TD0, TD1 are much smaller than the terms (TF0+TF1)*(N+2*NR)/2, (TF0+TF1) *(N+2*NR)/2, the propagation times T20, T21 are equal. Consequently, the period PHF of the signal CKHF is equal to 2*T21 and its cycle ratio is equal to ½.

Improvements in the oscillators 40 may also be made. In particular, the components C(1) to C(N) may be modified in accordance with FIG. 5. The $NC(i)=1+2^i$ cells F of the second arm of the component C(i) are assembled in groups of N0 cells F, with N0 being an even number. The first group comprises N1 cells F and the last group comprises N2 cells F.

One of the groups must necessarily comprise an odd number of cells F since the second arm comprises an odd number of cells F. In the example of FIG. 5, N1=N0 and N2 is an odd number. For example, for i greater than 2, it is possible to choose N1=N0=4 and N2=5 or else N1=N0=2 and N2=3.

The groups are series connected with the switch INTC2(i) between the input e and the output s of the component C(i). The common points between two groups are also connected together to the input e of the component C(i) by a switch INTC3(i) which is controlled by the signal S(i) provided via an inverter. The switch INTC3(i) is open when the signal S(i) is active.

This improvement of the components C(i) is used into account the difference between the propagation times in the first arm of the component C(i), which includes a single cell F, and the propagation times in the second arm of the component C(i), which comprises NC=1+$2^i$ cells F.

The propagation time T2(i), of a 0 or a 1, in the second arm is far lengthier than the propagation time T1 in the first arm. This is obviously due to the difference in the number of cells F in the two arms. This difference between the propagation times T1, T2(i) may lead to transmission errors, especially during the switching of the switches INTC1(i), INTC2(i) of a same component C(i), which switch over simultaneously.

The added switch INTC3(i) precharges the cells F of the second arm, which is inactive when the first arm is active (switch INTC1(i) is closed and switch INTC2(i) is open). In other words, the switch INTC3(i) enables the application, to the inputs of the cells F of the second arm, of the signal given by the component C(i+1). This signal would normally be applied if the second arm were active (switch INTC2(i) is closed and switch INTC1(i) is open).

Thus, the signal present at the input of the switch INTC2(i) has the same logic value as the one present at the input of the switch INTC1(i). If a switching of these two switches occurs, due to a variation in the number NR, then the switching takes place without risk of error. The correct signal then appears at the output s of the component C(i).

Variations of the component C(i) of FIG. 5 may also be planned. Since all the components C(0) to C(N) are series connected, the order in which they are connected matters little. It is thus quite possible to connect the cell C(0) between two adjacent cells C(i), C(i+1), or else to mix the order of the components C(1) to C(N). In the same way, the signal CKHF may be obtained at the output of any of the components C(0) to C(N) since they are series connected.

It is possible to choose N2=N0 and N1 as odd numbers. For example, for i greater than 2, it is possible to choose N2=N0=4 and N1=5 or else N2=N0=2 and N1=3. In this case, an inverter I is added and is series connected with the switch INTC3(i). Since N1 is an odd number, it is necessary to invert the signal present at the input e of the component C(i) before applying it to the groups of N0 cells F in order to obtain the right logic value at the input of the switch INTC2(i).

It is also possible to replace the least significant cell F of a group of cells by a cell F' comprising the same number NF of inverters, and a switch INTF that are series connected. A cell F' of this kind is described in detail by way of an example in FIG. 5. The switch INTF is controlled by the signal S(i), and is closed when the signal S(i) is active. If not, it is open.

Thus, the output of an inverter of the cell F' is never connected to the input e of the component C(i), namely to the output of an inverter of the component C(i+1). The switches INTC3, INTF are never simultaneously closed.

It is also possible to replace all the cells F by cells F'. In this case, the switches INTF of the most significant cells of the same group of cells F' are kept permanently closed. Only the switch INTF of the least significant cell F' of a same group is controlled by the signal S(i).

In this case, the circuit is simpler to make because it comprises a single type of cells F'. The general precision of the circuit is furthermore improved because the switching step, namely the variation in the period PHF when NR varies by 1 is identical regardless of the value of NR.

It is again possible to connect the switch INTC3 (or the inverter I as the case may be) not to the input e of the component C(i), but directly to the output OUT of the oscillator 40. In this case, an inverter I is used either for the even place value components or for the odd place value components to apply a signal of appropriate value to the input of the cells F.

The signal CKHF is then applied as a precharging signal to the cells F (or F'), instead of the signal given by the component C(i+1). Other variations may be contemplated. What is essential is to precharge the cells F (or F') of the second arm of each component C(i) so that the signals that appear at the input of the switches INTC1, INTC2 are identical (in particular, with the same phase).

That which is claimed is:

1. A signal generator comprising:
   an oscillator comprising N+1 components connected in series for providing an output signal from N logic signals representing an N-bit control number, with N being an integer greater than 1, said N+1 components comprising
   a least significant component being a last one of the N+1 components and outputting the output signal, and
   N most significant components with each most significant component being assigned a place value i ranging from 1 to N, and at least one of the N most significant components having a place value i greater than 1 comprising
   a first arm comprising a cell and a first switch connected in series therewith, said first switch being controlled by one of the N logic signals having a place value i corresponding to the place value of the at least one N most significant component with the place value i greater than 1, said first switch being in a first position when this logic signal is in a first logic state, and
   a second arm connected in parallel to said first arm and comprising a plurality of cells and a second switch connected in series therewith, said second switch being controlled by this logic signal and being in a second position opposite the first position when the logic signal is in the first logic state.

2. A signal generator according to claim 1, wherein the first position of said first switch is an open position and the second position of said second switch is a closed position; and wherein the first logic state of the logic signal is an active state.

3. A signal generator according to claim 1, wherein said plurality of second cells in the second arm is equal to $2^i+1$.

4. A signal generator according to claim 1, wherein the least significant component comprises at least one of an even number of inverters when N is an odd number and an odd number of inverters when N is an even number.

5. A signal generator according to claim 1, wherein each cell comprises an odd number of series connected inverters.

6. A signal generator according to claim 5, wherein at least one cell in the second arm further comprises a third switch connected in series with said inverters.

7. A signal generator according to claim 5, wherein each cell further comprises a third switch connected in series with said inverters.

8. A signal generator according to claim 1, wherein each of the N most significant components further comprises a precharge circuit for applying a precharge signal to said cells in the first and second arms.

9. A signal generator according to claim 8, wherein the precharge signal is at least one of the output signal and an inverse of the output signal.

10. A signal generator according to claim 8, each of the N most significant components has an input for receiving the precharge signal.

11. A signal generator according to claim 1, further comprising a comparator connected to said oscillator for comparing a period of the output signal with a desired period and for providing the N-bit control number, wherein the control number increases when the period of the output signal is less than the desired period, decreases when the period of the output signal is greater than the desired period, and remains constant when the period of the output signal is equal to the desired period.

12. A signal generator comprising:
an oscillator comprising N+1 components connected in series for providing an output signal from N logic signals representing an N-bit control number, with N being an integer greater than 1, said N+1 components comprising
a least significant component being a last one of the N+1 components and outputting the output signal, and
N most significant components with each most significant component being assigned a place value i ranging from 1 to N, and at least one of the N most significant components comprising
a first arm comprising a cell and a first switch connected in series therewith, said first switch being controlled by one of the N logic signals and is in a first position when this logic signal is in a first logic state, and
a second arm comprising a plurality of cells and a second switch connected in series therewith, said second switch being controlled by this logic signal and being in a second position opposite the first position when the logic signal is in the first logic state; and
a comparator connected to said oscillator for comparing a period of the output signal with a desired period and for providing the N-bit control number based upon the comparison.

13. A signal generator according to claim 12, wherein the first position of said first switch is an open position and the second position of said second switch is a closed position; and wherein the first logic state of the logic signal is an active state.

14. A signal generator according to claim 12, wherein the least significant component comprises an even number of inverters if N is an odd number and comprises an odd number of inverters if N is an even number.

15. A signal generator according to claim 10, wherein each cell comprises an odd number of series connected inverters.

16. A signal generator according to claim 15, wherein at least one cell in the second arm further comprises a third switch connected in series with said inverters.

17. A signal generator according to claim 12, wherein each of the N most significant components further comprises a precharge circuit for applying a precharge signal to said cells in the first and second arms.

18. A signal generator according to claim 12, wherein said comparator increases the control number when the period of the output signal is less than the desired period, decreases the control number when the period of the output signal is greater than the desired period, and keeps the control number constant when the period of the output signal is equal to the desired period.

19. An oscillator comprising:
N+1 components connected in series for providing an output signal from N logic signals representing an N-bit control number, with N being an integer greater than 1, said N+1 components comprising
a least significant component being a last one of the N+1 components and outputting the output signal, and
N most significant components with each most significant component being assigned a place value i ranging from 1 to N, and at least one of the N most significant components comprising
a first arm comprising a cell and a first switch connected in series therewith, said first switch being controlled by one of the N logic signals and is in a first position when this logic signal is in a first logic state, and
a second arm connected in parallel to said first arm and comprising a plurality of cells and a second switch connected in series therewith, said second switch being controlled by this logic signal and being in a second position opposite the first position when the logic signal is in the first logic state.

20. An oscillator according to claim 19, wherein the first position of said first switch is an open position and the second position of said second switch is a closed position; and wherein the first logic state of the logic signal is an active state.

21. An oscillator according to claim 19, wherein each cell comprises an odd number of series connected inverters.

22. An oscillator according to claim 21, wherein at least one cell in the second arm further comprises a third switch connected in series with said inverters.

23. An oscillator according to claim 19, wherein each of the N most significant components further comprises a precharge circuit for applying a precharge signal to said cells in the first and second arms.

24. An oscillator according to claim 23, wherein the precharge signal is at least one of the output signal and an inverse of the output signal.

25. A method for generating an output signal comprising:
generating N logic signals representing an N-bit control number, with N being an integer greater than 1;
providing the N logic signals to an oscillator comprising N+1 components connected in series, the N+1 components comprising a least significant component that is a last one of the N+1 components and outputting the output signal and N most significant components, with each N most significant component being assigned a place value i ranging from 1 to N, and at least one of the N most significant components comprising a first arm parallel connected to a second arm and performing switching in the first arm a first switch therein to a first position responsive to a corresponding logic signal having a first logic state, the first switch being connected in series with a cell, and
switching in the second arm a second switch therein to a second position opposite the first position responsive to the corresponding logic signal having the first logic state, the second switch being connected in series with a plurality of cells.

26. A method according to claim 25, further comprising comparing a period of the output signal with a desired period and for providing the N-bit control number based upon the comparison.

27. A method according to claim 25, wherein the first position of the first switch is an open position and the second position of the second switch is a closed position; and wherein the first logic state of the logic signal is an active state.

28. A method according to claim 25, wherein each cell comprises an odd number of series connected inverters.

29. A method according to claim 28, wherein at least one cell in the second arm further comprises a third switch connected in series with the inverters.

30. A method according to claim 25, further comprising applying a precharge signal to each of the cells.

31. A method according to claim 30, wherein the precharge signal is at least one of the output signal and an inverse of the output signal.

32. A method according to claim 25, further comprising increasing the control number when the period of the signal is less than the desired period, decreasing the control number when the period of the signal is greater than the desired period, and keeping the control number constant when the period of the signal is equal to the desired period.

* * * * *